(12) United States Patent
Kubo et al.

(10) Patent No.: US 7,521,306 B2
(45) Date of Patent: Apr. 21, 2009

(54) SEMICONDUCTOR DEVICE AND A METHOD OF FABRICATING THE SAME

(75) Inventors: Hirotoshi Kubo, Osaka (JP); Masanao Kitagawa, Osaka (JP); Masahito Onda, Osaka (JP); Hiroaki Saito, Osaka (JP); Eiichiroh Kuwako, Osaka (JP)

(73) Assignee: Sanyo Electric Co., Ltd, Moriguchi-chi, Osaka ( * ) Notice: Subject to any disclaimer, the term of this patent is extended or adjusted under 35 U.S.C. 154(b) by 732 days.

(21) Appl. No.: 11/194,446

(22) Filed: Aug. 2, 2005

(65) Prior Publication Data

US 2005/0266642 A1    Dec. 1, 2005

Related U.S. Application Data

(62) Division of application No. 09/988,272, filed on Nov. 19, 2001, now Pat. No. 6,939,776, which is a division of application No. 09/161,828, filed on Sep. 29, 1998, now abandoned.

(51) Int. Cl.
*H01L 21/336* (2006.01)
(52) U.S. Cl. ...................................... 438/197
(58) Field of Classification Search .................. 438/197
See application file for complete search history.

(56) References Cited

U.S. PATENT DOCUMENTS

| | | | |
|---|---|---|---|
| 4,879,254 A | 11/1989 | Tsuzuki et al. | |
| 4,898,835 A | 2/1990 | Cawlfield | |
| 5,173,435 A | 12/1992 | Harada | |
| 5,380,670 A | 1/1995 | Hagino | |
| 5,545,915 A | 8/1996 | Disney et al. | |
| 5,631,484 A | 5/1997 | Tsoi et al. | |
| 5,795,793 A | 8/1998 | Kinzer | |
| 5,879,968 A | 3/1999 | Kinzer | |
| 5,895,951 A | 4/1999 | So et al. | |
| 5,972,741 A | 10/1999 | Kubo et al. | |

FOREIGN PATENT DOCUMENTS

| | | |
|---|---|---|
| JP | 363224260 | 9/1988 |
| JP | 401287967 | 11/1989 |

*Primary Examiner*—Monica D. Harrison
(74) *Attorney, Agent, or Firm*—Westerman, Hattori, Daniels & Adrian, LLP.

(57) ABSTRACT

A power MOSFET comprises: a semiconductor substrate 21 of a first conduction type; a drain layer 22 of the first conduction type and formed on a surface layer of the substrate; a gate insulating film 25 formed in a partial region on the drain layer 22; a gate electrode 26 formed on the gate insulating film 25; an insulating film 27 formed on the gate electrode; a side wall insulator 28 formed on side walls of the gate insulating film 25, the gate electrode 26, and the insulating film 27; a recess formed on the drain layer 22 and in a region other than a region where the gate electrode 25 and the side wall insulator 28 are formed; a channel layer 23 of a second conduction type opposite to the first conduction type and formed in a range from the region where the recess is formed to a vicinity of the region where the gate electrode 26 is formed; a source region layer 24 of the one conduction type and formed on the channel layer 23 outside the recess; and a wiring layer 29 formed to cover the channel layer 23 which is exposed through the recess, the side wall insulator 28, and the insulating film.

6 Claims, 16 Drawing Sheets

SEMICONDUCTOR DEVICE AND A METHOD OF FABRICATING THE SAME

This application is a divisional of prior application Ser. No. 09/988,272, filed on Nov. 19, 2001, now U.S. Pat. No. 6,939,776 which is a divisional application of Ser. No. 09/161,828, filed Sep. 29, 1998, abandoned.

BACKGROUND OF THE INVENTION

1. Field of the Invention

The present invention relates to a semiconductor device and a method of fabricating it, and more particularly to reduction of the number of mask steps in a process of fabricating a power MOSFET, and the like.

2. Description of the Related Art

Hereinafter, a power MOSFET of the prior art will be described with reference to the drawings. FIG. 19 is a section view showing the structure of a planar type power MOSFET of the prior art.

In the power MOSFET, as shown in FIG. 19, a drain layer 2 consisting of an n− epitaxial layer is formed on an n+ semiconductor substrate 1, and a channel layer 3 is formed in a part of the drain layer by diffusion of a p-type impurity. A body region layer 5 is formed at the center of the channel region by diffusing a p+ impurity. A source region layer 4 which is formed by diffusion of an n+ impurity is disposed in the surface layer of the channel layer 3 so as to surround the body region layer.

A gate insulating film 6 and a gate electrode 7 are sequentially formed on the channel layer 3 so as to overlap with a part of the channel layer 3 and the source region layer 4. A PSG (Phospho-Silicate Glass) film 8 is formed so as to cover the gate insulating film and the gate electrode. In the PSG film 8, an opening is formed in the region where the body region layer 5 is formed and a part of the region where the source region layer 4 is formed. The body region layer 5 and the part of the source region layer 4 are partly exposed. A wiring layer 9 for contact to the body region layer 5 and a part of the source region layer 4 is formed so as to cover the layers and the PSG film 8.

The steps of fabricating the power MOSFET will be described with reference to FIGS. 20 to 25.

First, the n− drain layer 2 is formed on the n+ semiconductor substrate 1 by epitaxial growth. Next, a thick oxide film is formed on the drain layer, and a photolithography process selectively forms a resist film. A patterning process is conducted on the thick oxide film with using the resist film as a mask, and then an oxide film, which will be formed as the gate insulating film is again formed. Although the thick oxide film is not shown in any of FIGS. 20 to 25, the thick oxide film is required in a region where a bonding pad is to be formed.

Thereafter, a polysilicon layer is formed on the entire surface of the semiconductor substrate, a photoresist film is formed, and then a patterning process is conducted by the photolithography method. The polysilicon layer and the oxide film are etched with using the patterned resist film as a mask, so that the gate insulating film 6 and the gate electrode 7 are formed as shown in FIG. 20.

Next, a p-type impurity is injected with using the gate insulating film 6 and the gate electrode 7 as a mask, to form the channel layer 3 on the drain layer 2 as shown in FIG. 21.

As shown in FIG. 22, a photoresist is then applied to the entire surface, and a patterning process is conducted by the photolithography method so that an opening is formed in a part of the channel layer 3. A p-type impurity is injected into the channel layer 3 with using the patterned resist film PR1 as a mask, to form the body region layer 5.

As shown in FIG. 23, the patterned resist film PR1 is then removed away, a photoresist is again applied to the entire surface, and then patterned by the photolithography method so that a resist film PR2 is formed on the region where the body region layer 5 is formed, and an n-type impurity is thereafter injected into the channel layer 3 with using the resist film PR2, the gate electrode 6, and the like as a mask.

Thereafter, the PSG film 8 is formed on the entire surface as shown in FIG. 24. A photoresist (not shown) is again applied and the resist is patterned by the photolithography method so that an opening is formed on the body region layer 5 and a part of the source region layer 4.

Next, the PSG film 8 is etched with using the resist as a mask to expose the regions of the body region layer 5 and a part of the source region layer 4 (FIG. 25).

A film of a metal such as aluminum is then formed on the entire surface by sputtering or vapor deposition. A resist film is formed, and then patterned by the photolithography method. The metal film is etched away with using the patterned resist film as a mask to form the wiring layer 9, thereby completing the power MOSFET having the structure shown in FIG. 19.

In the above, a planar type power MOSFET has been described. As a power MOSFET of another kind, known is a trench type power MOSFET in which a trench is formed in a substrate and a gate electrode is embedded in the trench.

Hereinafter, a trench type power MOSFET will be described with reference to FIG. 26.

As shown in FIG. 26, the power MOSFET comprises a semiconductor substrate 11, an n− drain layer 12 which is formed on the substrate by epitaxial growth, and a p-type channel layer 13.

In a part of the channel layer 13 and the drain layer 12, a trench which passes through the layers is formed. A gate insulating film 16 made of an oxide film or the like is formed on the inner face of the trench. A gate electrode 17 made of polysilicon or the like is formed so as to fill the trench.

A source region layer 15 of an n+ impurity is formed in the surface of the channel layer 13 so as to be on both the sides of the gate electrode 17. A p+ body region layer 14 is formed at a center portion of the source region layer 15.

A PSG film 18 is formed so as to cover the gate electrode 17. An opening is formed in a part of the PSG film 18. The body region layer 14, and a part of the source region layer 15 which surrounds the body region layer are exposed through the opening. A wiring layer 19 for contact to the body region layer 14 and the part of the source region layer 15, is formed on the layers and the PSG film 18.

For the above-described planar type power MOSFET, a photomask for a photolithography process for patterning is required in each of the following steps:

1) the step of forming the mask for forming the thick oxide film for the bonding pad, 2) the step of forming the patterning mask for forming the gate electrode (FIG. 20), 3) the step of forming the resist mask for forming the body region 5 (FIG. 22), 4) the step of forming the resist mask for forming the source region 4 (FIG. 23), 5) the step of forming the resist mask in the case where the contact hole of the source region 4 is formed in the PSG film 8 (FIG. 25), and 6) the step of forming the resist mask for patterning the wiring layer.

As a result, six photomasks are required in total.

Therefore, problems in that the number of mask steps and accompanying steps is very large, that the production process is complicated, and that the production cost is high are produced.

In the production process of a trench type power MOSFET, a body region layer and a source region layer are formed with using a photoresist as a mask. Therefore, the fine patterning is limited and it is difficult to increase the cell density.

SUMMARY OF THE INVENTION

The invention has been conducted in view of the defects of the prior art. The object of the invention is to provide a power MOSFET Device with a high cell density.

Another object of the invention is to reducing the number of steps in a process fabricating a power MOSFET.

The object can be attained by the following configurations.

As shown in FIG. 1, a first aspect of the present invention is a device of a semiconductor device, which comprises: a semiconductor substrate of a first conduction type; a drain layer of the first conduction type and formed on a surface layer of the semiconductor substrate; a gate insulating film formed in a partial region on the drain layer; a gate electrode formed on the gate insulating film; an insulating film formed on the gate electrode; a side wall insulator formed on side walls of the gate insulating film, the gate electrode, and the insulating film; a recess formed on the drain layer and in a region other than a region where the gate electrode and the side wall insulator are formed; a channel layer of an opposite conduction type and formed in a range from the region where the recess is formed to a vicinity of the region where the gate electrode is formed; a source region layer of the one conduction type and formed on the channel layer in a region outside the recess; and a wiring layer formed to cover the channel layer which is exposed through the recess, the side wall insulator, and the insulating film.

A second aspect of the present invention is a device of semiconductor device, which comprises: a semiconductor substrate of one conduction type; a drain layer of the one conduction type and formed on a surface layer of the semiconductor substrate; a channel layer of an opposite conduction type and formed on the drain layer; a trench which passes through the channel layer to reach the drain layer; a gate insulating film formed in a region from an inner wall of the trench to the channel layer in the periphery of a region where the trench is formed; a gate electrode formed on the gate insulating film to fill the trench; an insulating film formed on the gate electrode; a side wall insulator formed on side walls of the gate insulating film, the gate electrode, and the insulating film; a recess formed on a part of the channel layer in a region other than a region where the gate electrode and the side wall insulator are formed; a source region layer formed on the channel layer in a region outside the recess; a body region layer formed on the channel layer which is below a region where the recess is formed; and a wiring layer formed to cover the source region layer, the body region layer, the side wall insulator, and the insulating film.

A third aspect of the present invention is a method of fabricating a semiconductor device comprises the steps of: forming a drain layer of one conduction type on a surface layer of a semiconductor substrate of the one conduction type; forming a first insulating film on the drain layer; forming a conductive layer on the first insulating film; forming a second insulating film on the conductive layer; patterning the second insulating film, the conductive layer, and the first insulating film, to form a gate insulating film from the first insulating film, and a gate electrode from the conductive layer; implanting an impurity of an opposite conduction type into a surface layer of the drain layer with using the gate electrode as a mask, thereby forming a channel region layer; implanting an impurity of the one conduction type into the channel region layer with using the gate electrode as a mask, thereby forming a one conduction type impurity region layer; forming a third insulating film which covers a surface of the one conduction type impurity region layer, side walls of the gate insulating film, the gate electrode, and the second insulating film, and an upper face of the second insulating film; etching back the third insulating film to form a side wall insulator consisting of the third insulating film, on side walls of the gate insulating film, the gate electrode, and the second insulating film, and etching the one conduction type impurity region layer to form a recess, thereby forming a source region layer consisting of a part of the one conduction type impurity region layer; and forming a metal layer on an entire surface, and patterning the metal layer, thereby forming a wiring layer.

A fourth aspect of the present invention is method of fabricating a semiconductor device comprises the steps of: forming a drain layer of one conduction type on a surface layer of a semiconductor substrate of the one conduction type, and then diffusing an impurity of an opposite conduction type into a whole surface layer of the drain layer, thereby forming a channel layer; forming a plurality of trenches which pass through the channel layer to reach the drain layer; forming a first insulating film on an inner wall of each of the trenches and a surface of the channel layer; forming a conductive layer on the first insulating film; forming a second insulating film on the conductive layer; patterning the second insulating film, the conductive layer, and the first insulating film with using a same mask, to form a gate insulating film from the first insulating film, and a gate electrode from the conductive layer; implanting an impurity of the one conduction type into a surface layer of the channel layer with using the gate electrode as a mask, thereby forming a one conduction type impurity region layer; forming a third insulating film on an entire surface; etching back the third insulating film to form a side wall insulator which covers side walls of the gate insulating film, the gate electrode, and the first insulating film; applying a photoresist on an entire surface, performing exposure and developing processes to form an opening at a center portion of the one conduction type impurity region layer, and performing an etching process with using the resist film as a mask, thereby forming a recess which passes through the center portion of the one conduction type impurity region layer and reaches the channel layer, and forming a source region layer consisting of a part of the one conduction type impurity region layer; implanting an impurity of the opposite conduction type into a lower portion of the recess, with using the resist film as a mask, thereby forming a body region layer; and removing the resist film, forming a metal layer which covers the source region layer, the body region layer, the side wall insulator, and the second insulating film, and patterning the metal layer, thereby forming a wiring layer.

DESCRIPTION OF THE PREFERRED EMBODIMENTS

First Embodiment

Hereinafter, a planar type power MOSFET according to a first embodiment of the invention will be described with reference to the accompanying drawings.

Figure 1:
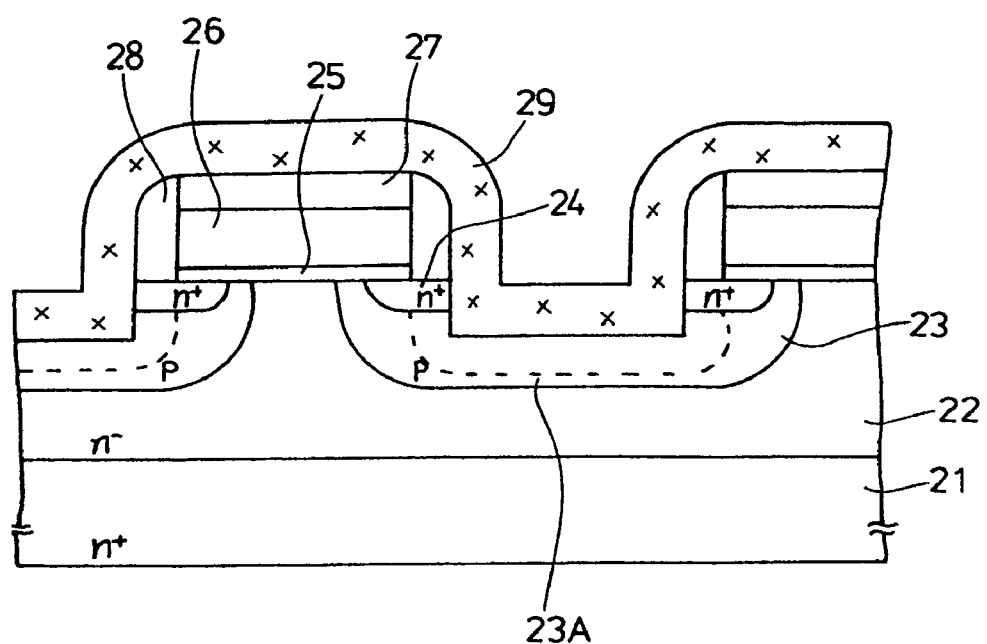
FIG. 1 is a section view illustrating the structure of a planar type power MOSFET according to a first embodiment of the invention.
Figure 2:
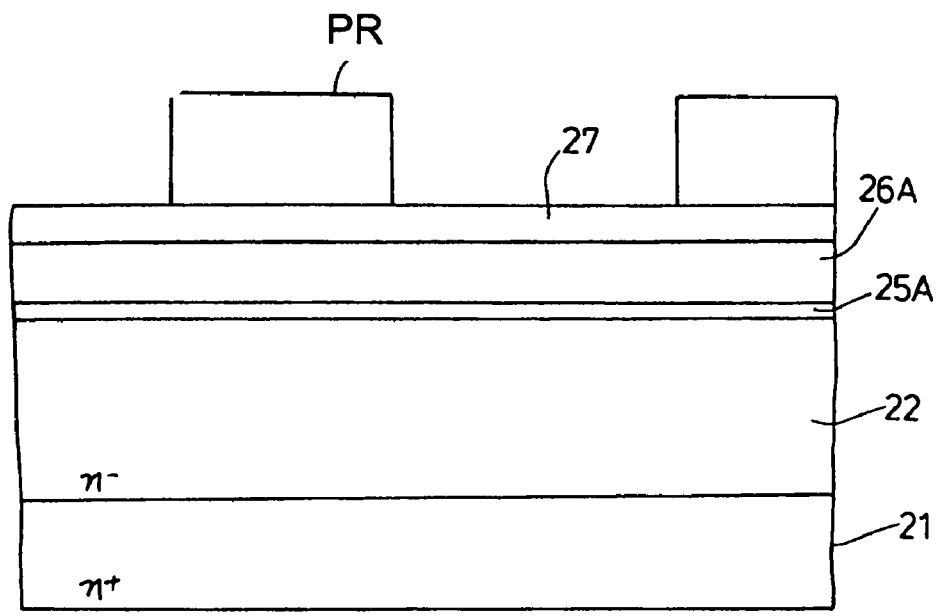
FIG. 2 is a section view illustrating a method of fabricating the power MOSFET according to the first embodiment of the invention.

FIG. 1 is a section view showing the structure of a planar type power MOSFET according to the embodiment. In the specification, an n-channel transistor will be described as an example. The embodiment can be applied also to a p-channel transistor.

In the power MOSFET, as shown in FIG. 1, a drain layer 22 consisting of an n– epitaxial layer is formed on an n+ semiconductor substrate 21. A gate insulating film 25, a gate electrode 26, and an NSG film 27 are sequentially formed in a part of the drain layer 22.

A side wall insulator 28 which similarly consists of an NSG film is formed on side walls of the gate insulating film 25, the gate electrode 26, and the NSG film 27.

A channel layer 23 is formed by diffusion of a p-type impurity on the epitaxial layer 22 and on both the sides of the region where the gate insulating film 25, the gate electrode 26, and the NSG film 27 are formed. A recess in which end portions respectively coincide with side ends of the side wall insulator 28 is formed at a center portion of the channel layer 23. An n+ source region layer 24 is formed so as to surround the recess.

A wiring layer 29 consisting of a film of a metal such as aluminum is formed so as to cover the channel layer 23, the side wall insulator 28, and the NSG film 27 in the recess, thereby enabling a contact to the source region layer 24 to be established.

Hereinafter, a method of fabricating the power MOSFET having the above-described structure will be described with reference to the drawings. FIGS. 2 to 5 are section views illustrating the method of fabricating the power MOSFET according to the embodiment.

First, the n– drain layer 22 is formed on the n+ semiconductor substrate 21 by epitaxial growth. Next, a thick oxide film having a thickness of about 5,000 to 10,000 A is formed on the drain layer, and a photolithography process selectively forms a resist film. The oxide film is patterned by etching with using the resist film as a first mask. Although the thick oxide film is not shown in any of FIGS. 2 to 5, the thick oxide film is required in a region where a bonding pad will be formed later. Thereafter, an oxide film 25A which will be formed as the gate insulating film is again grown.

Thereafter, a polysilicon layer 26A having a thickness of about 5,000 A is formed on the upper entire surface of the oxide film, and the NSG film 27 having a thickness of about 5,000 to 10,000 A is then formed on the entire surface. A photoresist is applied to the entire surface, and then patterning is performed by exposure and developing processes, thereby forming a resist film PR. As a result of the steps described above, the structure of FIG. 2 in which the patterned resist film PR is formed on the upper face is obtained.

Figure 3:
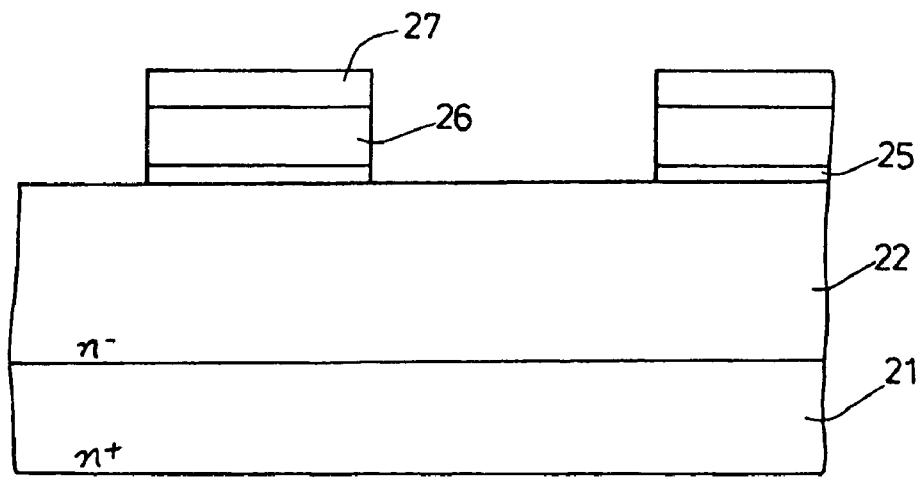
FIG. 3 is a section view illustrating the method of fabricating the power MOSFET according to the first embodiment of the invention.
Figure 4:
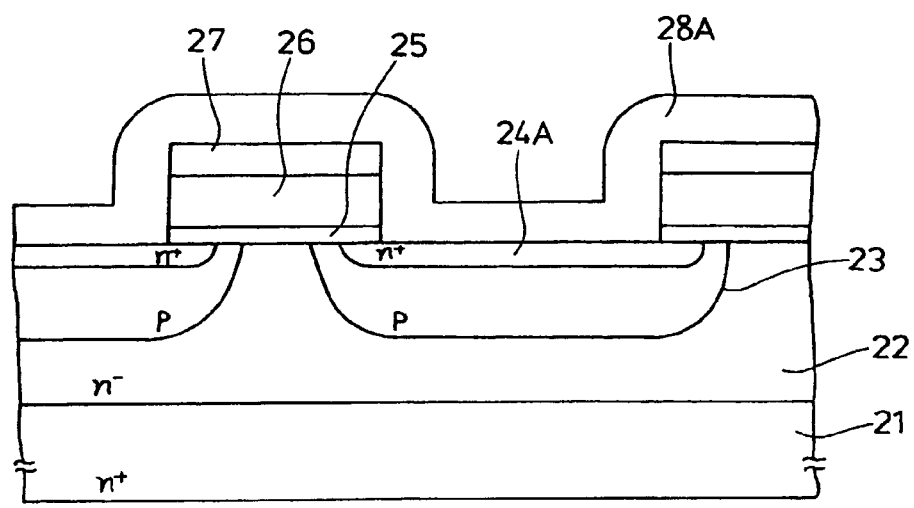
FIG. 4 is a section view illustrating the method of fabricating the power MOSFET according to the first embodiment of the invention.

Next, the NSG film 27, the polysilicon layer 26A, and the oxide film 25A are subjected to dry etching with using the patterned resist film PR as a mask, so that the gate insulating film 25 and the gate electrode 26 are simultaneously formed as shown in FIG. 3.

Thereafter, boron which is a p-type impurity is injected with using the gate insulating film 25 and the gate electrode 26 as a mask and under conditions of a dose amount of $5\times10^{13}/cm^2$ and an acceleration voltage of 80 keV, thereby forming the channel layer 23 on the n− epitaxial layer 22.

In succession to this step, as which is an n-type impurity is injected with using the gate insulating film 25 and the gate electrode 26 as a mask and under conditions of a dose amount of $1\times10^{16}/cm^2$ and an acceleration voltage of 140 keV, thereby forming an n+ impurity diffusion layer 24A in the surface.

Next, an NSG film 28A having a thickness of 8,000 A is formed on the entire surface. As a result of the steps described above, the structure of FIG. 4 is obtained.

Thereafter, the entire surface is etched back by anisotropic etching.

As a result of this step, the side wall insulator 28 is formed on the side walls of the gate insulating film 25, the gate electrode 26, and the NSG film 27, and at the same time a part of the channel layer 23 is etched, with the result that a recess OB having a depth of about 0.2 to 0.6 μm is formed in the layer.

Figure 5:
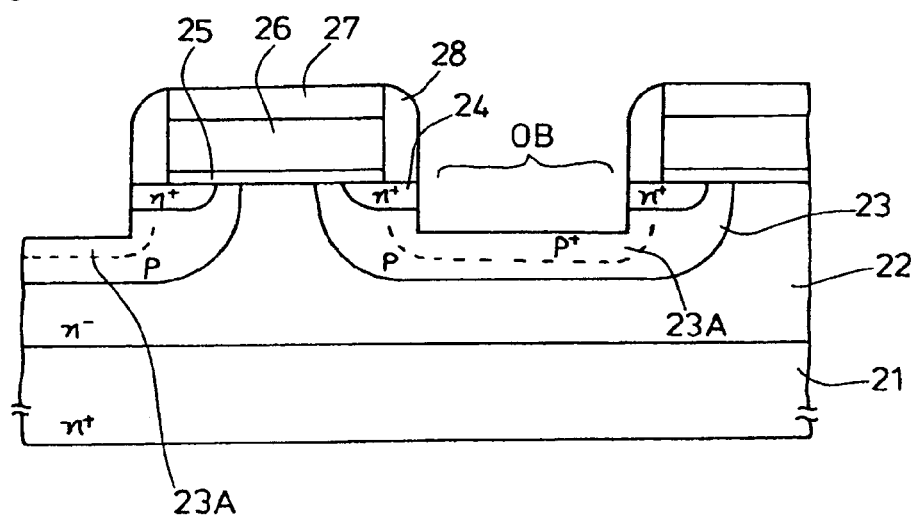
FIG. 5 is a section view illustrating the method of fabricating the power MOSFET according to the first embodiment of the invention.

The formation of the recess OB causes the n+ impurity diffusion layer 24A to form the source region layer 24 penetrated by the recess OB, as shown in FIG. 5, and the source region layer 24 to be simultaneously formed.

Thereafter, boron is implanted under conditions of 35 keV and $5\times10^{15}/cm^2$ to form a p+ body contact 23A.

Next, a film of a metal such as aluminum and having a thickness of about 3 μm is formed on the entire surface by vapor deposition or sputtering, and then patterned, thereby completing the planar type power MOSFET shown in FIG. 1.

In the method of fabricating a semiconductor device according to the embodiment, the NSG film 27 is formed on the gate electrode 26, the NSG film 28A is then formed on the entire surface, the NSG film is etched back to form the side wall insulator 28, and the recess OB is formed in the epitaxial layer 22, thereby forming the source region layer 24. Therefore, a photomask step which, in the prior art, must be conducted in the patterning for forming the source region 24 is not required.

In the entire process of the first embodiment of the invention, a photomask is required only in the following three steps:

1) the step of forming the mask for forming the thick oxide film for the initial bonding pad,
2) the step of forming the patterning mask for forming the gate electrode (FIG. 2), and
3) the step of forming the mask for forming the wiring layer.

In the embodiment, as described above, it is required to use only the three photomasks in total. Unlike the prior art in which six photomasks are used, the problems in that the number of mask steps and accompanying steps is very large, that the production process is complicated, and that the production cost is high can be suppressed. Although it is sometimes required to use one more mask for forming a gate contact, the number of the total mask is reduced. Further plurality of the power MOSFETs can be integrated on a cell region of a substrate in a matrix structure.

Further, according to the first embodiment, since the recess is formed so as to be coincided with the end of the side wall insulator 38, a length between the source contact region and channel region is reduced and as a result, ON-resistance of the power MOSFET is reduced.

Second Embodiment

Hereinafter, a second embodiment of the invention will be described with reference to the accompanying drawings.

Figure 6:
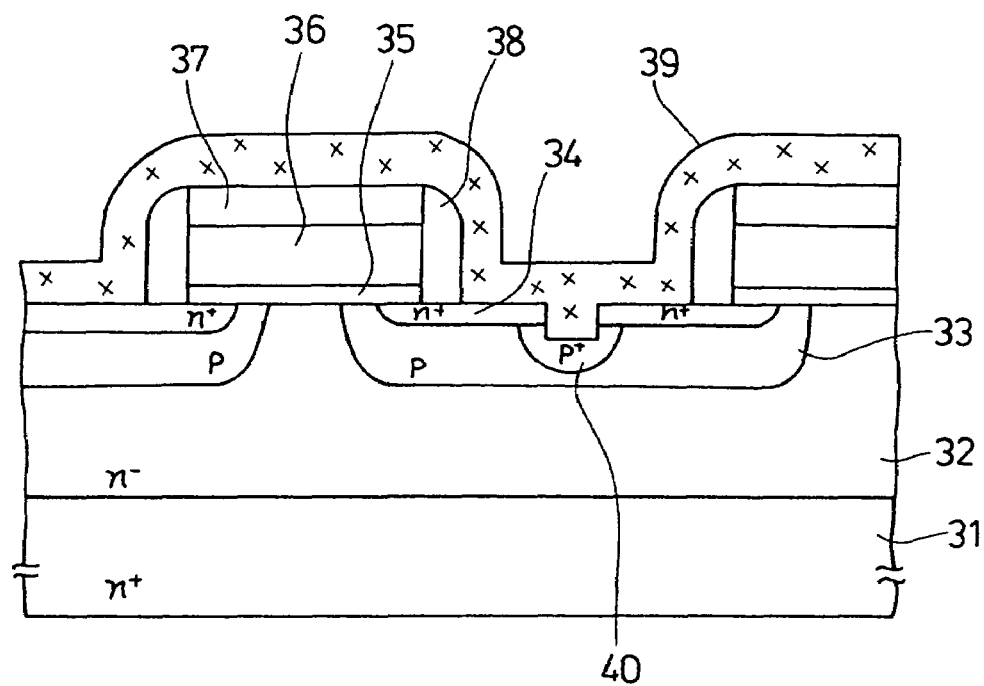
FIG. 6 is a view illustrating the structure of a planar type power MOSFET according to a second embodiment of the invention.

FIG. 6 is a section view illustrating the structure of a planar type power MOSFET according to the second embodiment of the invention.

As shown in FIG. 6, the power MOSFET according to the second embodiment of the invention is very similar in structure to the power MOSFET of the first embodiment which has been described with respect to FIG. 1. The embodiment is different from the first embodiment in that a p+ body region 40 is formed in a source region layer 34, that the source region layer 34 is wider than the source region layer of the first embodiment, and that the upper face of the layer is exposed.

In the power MOSFET according to the second embodiment of the invention, as shown in FIG. 6, an n− epitaxial layer 32 is formed on an n+ semiconductor substrate 31. A gate insulating film 35, a gate electrode 36, and an NSG film 37 are sequentially formed in a part of the epitaxial layer 32.

A side wall insulator 38 which similarly consists of an NSG film is formed on side walls of the gate insulating film 35, the gate electrode 36, and the NSG film 37.

A channel layer 33 is formed by diffusion of a p-type impurity on the epitaxial layer 32 and on both the sides of the region where the gate insulating film 35, the gate electrode 36, and the NSG film 37 are formed. A recess in which end portions respectively are disposed inside of side ends of the side wall insulator 38 is formed at a center portion of the channel layer 33. An n+ source region layer 34 is formed so as to surround the recess.

A wiring layer 39 consisting of a film of a metal such as aluminum is formed so as to cover the channel layer 33, the side wall insulator 38, and the NSG film 37 in the recess, thereby enabling a contact to the source region layer 34 to be established Hereinafter, a method of fabricating the power MOSFET having the above-described structure will be described with reference to the drawings. FIGS. 7 to 11 are section views illustrating the method of fabricating the power MOSFET according to the embodiment.

First, the n− epitaxial layer 32 is formed on the n+ semiconductor substrate 31 by epitaxial growth. Next, a thick oxide film is formed on the epitaxial layer, and then patterned. Thereafter, an oxide film which will be formed as the gate insulating film is again grown. Although the thick oxide film is not shown in any of FIGS. 7 to 11, the thick oxide film is required in a region where a bonding pad is to be formed.

Thereafter, a polysilicon layer is formed on the whole of the upper face, and an NSG film is formed on the entire surface. A photoresist is applied to the entire surface, and then patterning is performed by exposure and developing processes.

Figure 7:
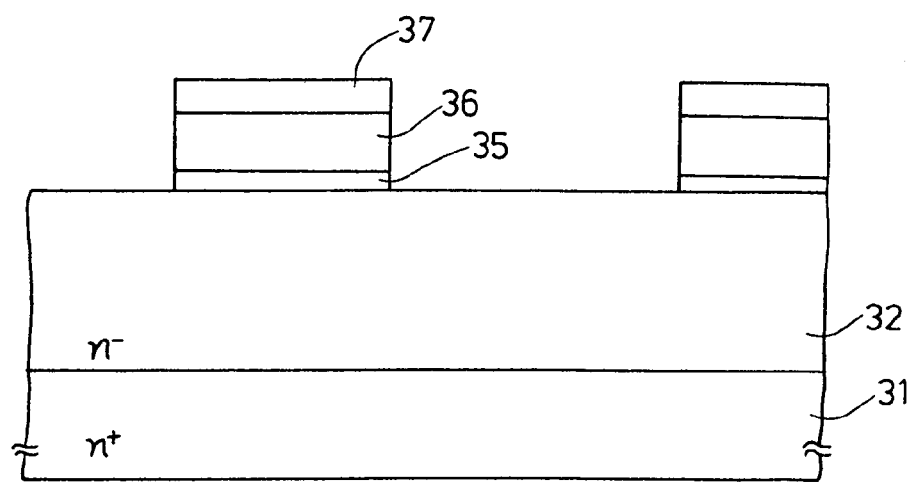
FIG. 7 is a section view illustrating a method of fabricating the power MOSFET according to the second embodiment of the invention.

Next, the NSG film 37, the polysilicon layer 36A, and the oxide film 35A are patterned by etching with using the patterned resist film PR as a mask, so that the gate insulating film 35 and the gate electrode 36 are simultaneously formed as shown in FIG. 7 and the NSG film 37 having the same pattern as the gate insulating film and the gate electrode is obtained.

Figure 8:
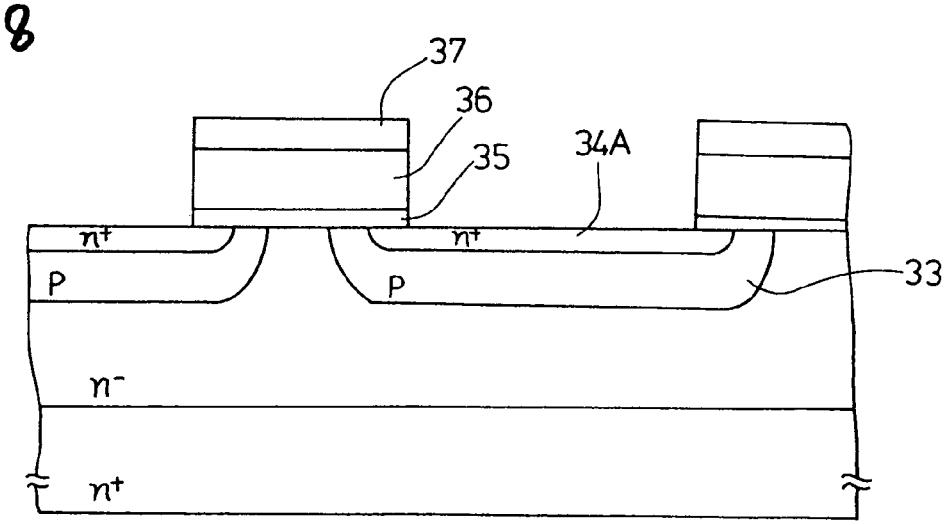
FIG. 8 is a section view illustrating the method of fabricating the power MOSFET according to the second embodiment of the invention.

Thereafter, a p-type impurity is injected with using the gate insulating film 35 and the gate electrode 36 as a mask, thereby forming the p-type channel layer 33 on the n− epitaxial layer 32 as shown in FIG. 8. In succession to this step, an n-type impurity is injected with using the gate insulating film 35 and the gate electrode 36 as a mask, thereby forming an n+ impurity diffusion layer 34A in the surface.

Figure 9:
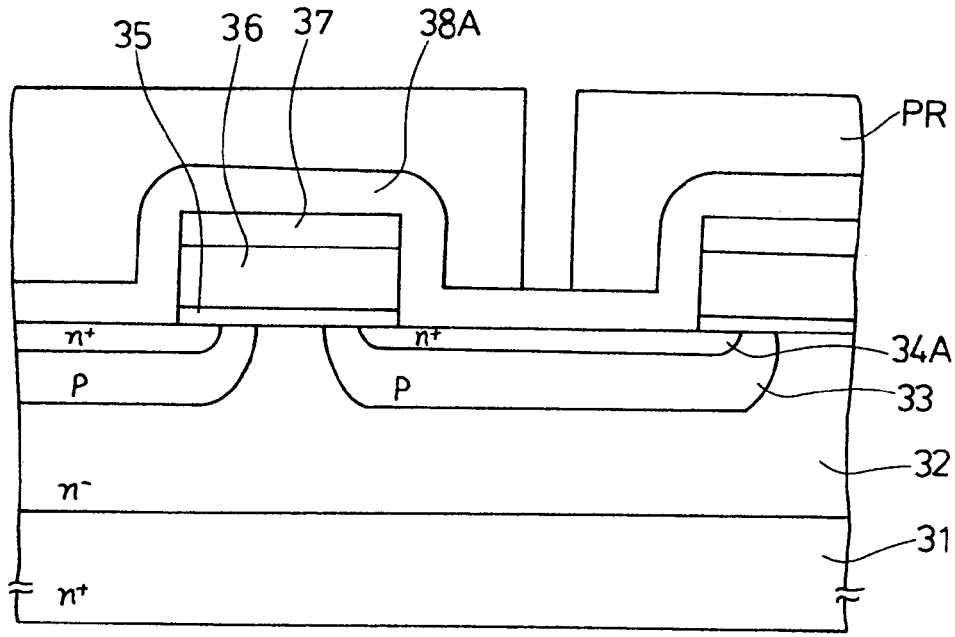
FIG. 9 is a section view illustrating the method of fabricating the power MOSFET according to the second embodiment of the invention.

Next, an NSG film 38A is again formed on the entire surface, and a photoresist is applied to the entire surface. Then, patterning is performed by exposure and developing processes with using the photomask, thereby forming an opening in the resist PR in the region where the body region 40 will be formed later (FIG. 9).

Figure 10:
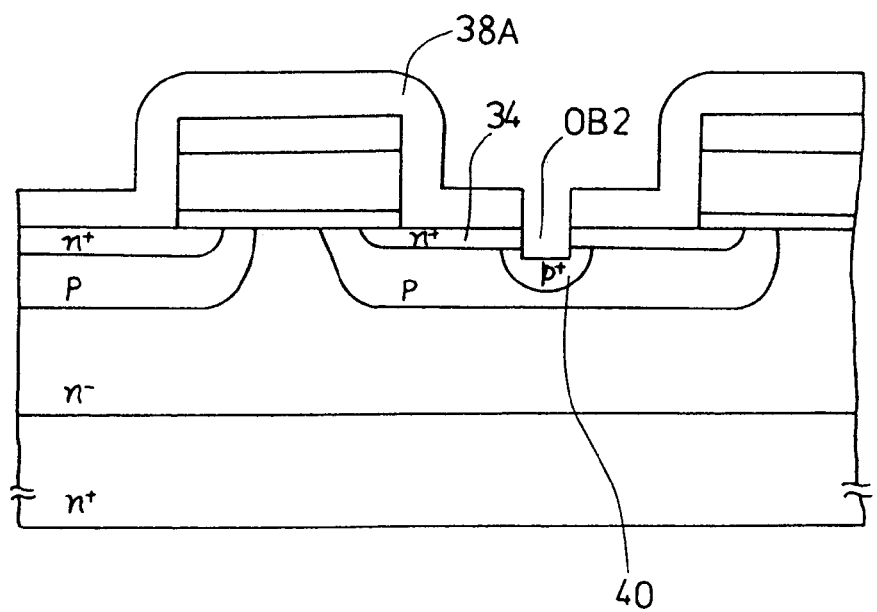
FIG. 10 is a section view illustrating the method of fabricating the power MOSFET according to the second embodiment of the invention.

The n+ impurity diffusion layer 34A formed on the surface of epitaxial layer 32 is etched away with using the resist PR as a mask, thereby forming a recess OB2. As a result, the region layer 34 is formed. Thereafter, a p-type impurity is injected into the recess OB2 to form the body region 40 (FIG. 10).

Figure 11:
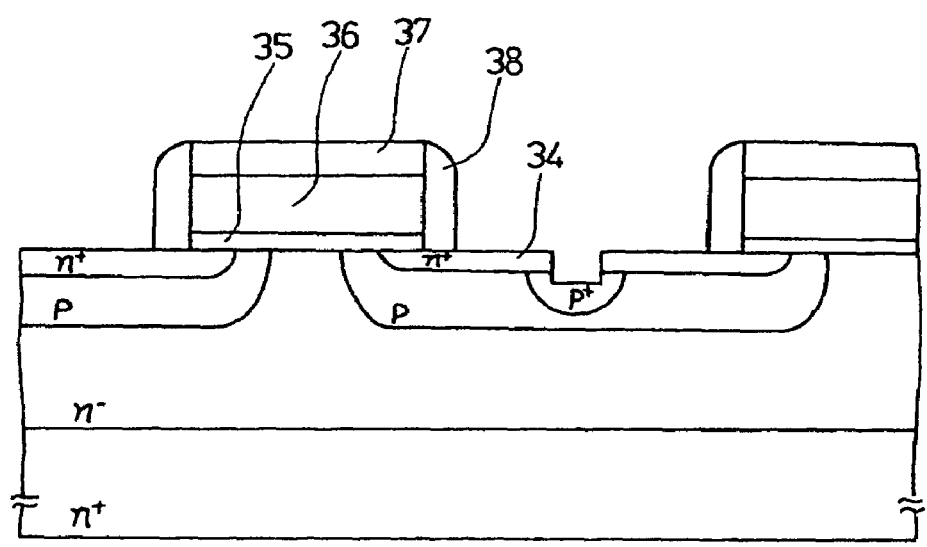
FIG. 11 is a section view illustrating the method of fabricating the power MOSFET according to the second embodiment of the invention

Thereafter, the resist is removed away and the entire surface is etched back by anisotropic etching. As a result of this step as shown in FIG. 11, the side wall insulator 38 is formed on the side walls of the gate insulating film 35, the gate electrode 36, and the NSG film 37, and at the same time the source region 34 is exposed. And then if required, gate contact region is formed (not shown).

Next, a film of a metal such as aluminum is formed on the entire surface by vapor deposition or sputtering, and then patterned, thereby completing the planar type power MOSFET shown in FIG. 6.

In the method of fabricating a semiconductor device according to the embodiment, the NSG film 37 is formed on the gate electrode 36, the NSG film 38A is then formed on the entire surface, the NSG film is etched back to form the side wall insulator 38, and the recess OB2 for forming the body region is formed in the epitaxial layer 32, thereby forming the source region layer 34. Therefore, a photomask step which, in the prior art, must be conducted in the patterning for forming the source region is not required.

In the entire process of the second embodiment of the invention, a photomask is required only in the following four steps:

1) the step of forming the mask for forming the thick oxide film for the initial bonding pad, 2) the step of forming the patterning mask for forming the gate electrode (FIG. 7), 3) the step of forming the mask for forming the recess for forming the body region (FIG. 9), and 4) the step of forming the mask for forming the wiring layer.

In the embodiment, as described above, it is required to use only the four photomasks in total. Unlike the prior art in which six photomasks are used, the problems in that the number of mask steps and accompanying steps is very large, that the production process is complicated, and that the production cost is high can be suppressed.

The conditions such as thickness of the films in the second embodiment are identical with those of the first embodiment, and hence their description is omitted. Further plurality of the power MOSFETs can be integrated on a cell region of a substrate in a matrix structure.

Further, according to the second embodiment, since the recess is selectively formed at a center portion on a surface of the source region, a contact area of the wiring layer contact with the source region is sufficiently large and as a result, ON-resistance of the power MOSFET is reduced and an endure against avalanche is improved.

Third Embodiment

Figure 12:
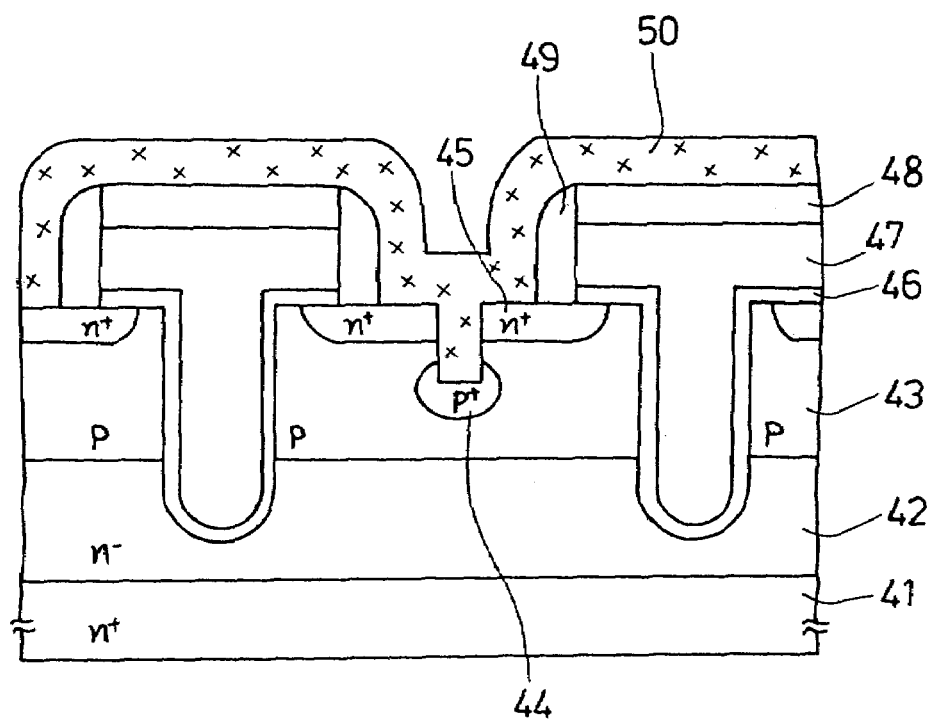
FIG. 12 is a view illustrating the structure of a trench type power MOSFET according to a third embodiment of the invention.

Hereinafter, a power MOSFET having a trench structure according to the embodiment of the invention will be described with reference to the accompanying drawings. FIG. 12 is a section view illustrating the structure of the power MOSFET according to the embodiment.

First, the structure of the power MOSFET will be described.

In the power MOSFET, as shown in FIG. 12, an n− drain layer 42 is formed by epitaxial growth on a semiconductor substrate 41 made of n+ silicon. A channel layer 43 consisting of a p+ impurity diffusion layer is formed on the surface layer of the drain layer 42. In the semiconductor substrate 41, trench which passes through the channel layer 43 to reach to the drain layer 42 on the substrate are formed. (The channel layer 43 can be formed by epitaxtial growth.) A gate insulating film 46 made of a silicon oxide film having a thickness of about 500 A is formed on the surface of each trench.

A gate electrode 47 made of polysilicon is formed on the gate insulating film 46 so as to fill the trench.

A recess is formed in a part of the surface layer of the channel layer 43 which is penetrate into plural portions by the trench. A source region layer 45 consisting of an n+ impurity diffusion layer is formed on the channel layer 43 and so as to surround the recess. A body region layer 44 consisting of a p+ impurity diffusion layer is formed in the channel layer 43 below the recess. The source region layer may be formed before the formation of the trench.

An NSG film 48 having the same pattern as the gate electrode 47 is formed so as to cover the upper portion of the gate electrode 47. Furthermore, a side wall insulator 49 which also is made of an NSG film is formed on the side walls of the NSG film 48, the gate electrode 47, and the gate insulating film 46.

A wiring layer 50 consisting of a film of a metal such as aluminum and having a thickness of about 3 μm is formed so as to cover the NSG film 48, the side wall insulator 49, the exposed source region layer 45, and the body region layer 44.

Hereinafter, a method of fabricating the trench type power MOSFET will be described with reference to the drawings. FIGS. 13 to 18 are section views illustrating the method of fabricating the power MOSFET according to the embodiment.

First, the n− drain layer 42 is formed on the n+ semiconductor substrate 41 by epitaxial growth. Next, boron which is a p+ impurity is injected into the entire surface of the surface layer of the drain layer 42 under conditions of a dose amount of $5 \times 10^{13}/cm^2$, thereby forming the channel layer 43. The channel layer 43 can be formed by epitaxial growth.

Next, a resist mask is formed, and an etching process is performed with using it as a mask, thereby forming the trench which passes through the channel layer 43 to reach the drain layer 42.

The entire surface is then oxidized to form the gate insulating film 46 which extends over from the surface of the channel layer 43 to the inner wall of trench. A polysilicon layer 47A is formed on the upper face of the film by the CVD method so as to have a thickness of about 5,000 A.

Figure 13:
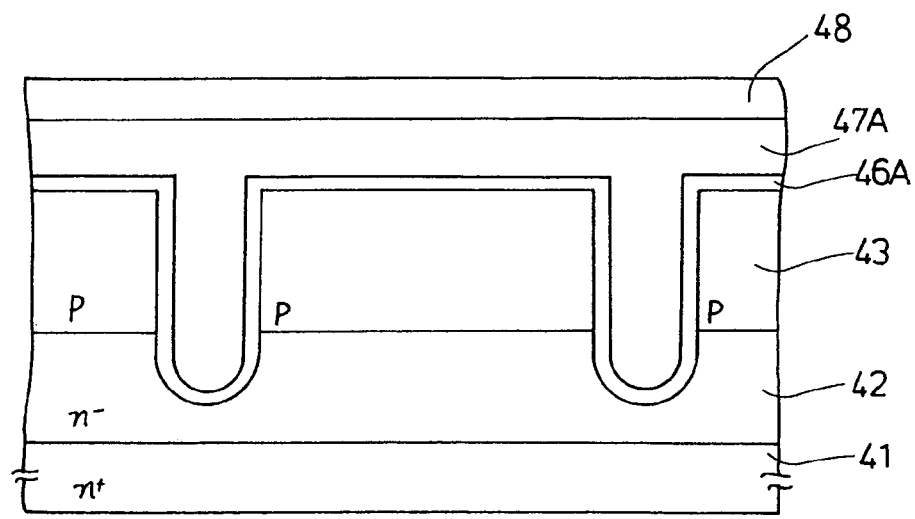
FIG. 13 is a section view illustrating a method of fabricating the power MOSFET according to the third embodiment of the invention.

Thereafter, an NSG film 48 is formed on the entire surface, thereby obtaining the structure of FIG. 13.

Figure 14:
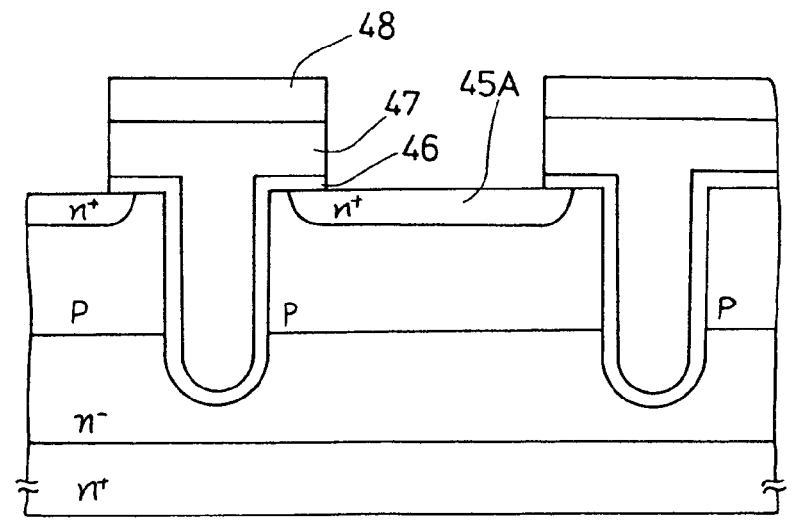
FIG. 14 is a section view illustrating the method of fabricating the power MOSFET according to the third embodiment of the invention.

Next, a photoresist is applied to the entire surface, and patterning is performed by exposure and developing processes, thereby causing the photoresist to selectively remain on the NSG film 48 in the region including that where the trench is formed. The polysilicon layer 47A and the NSG film 48 are etched away with using the photoresist as a mask to form the gate electrode 47. Next, an n+ impurity is injected into the channel layer 43 with using the gate electrode as a mask, thereby forming an n-type impurity region layer 45A (FIG. 14).

Figure 15:
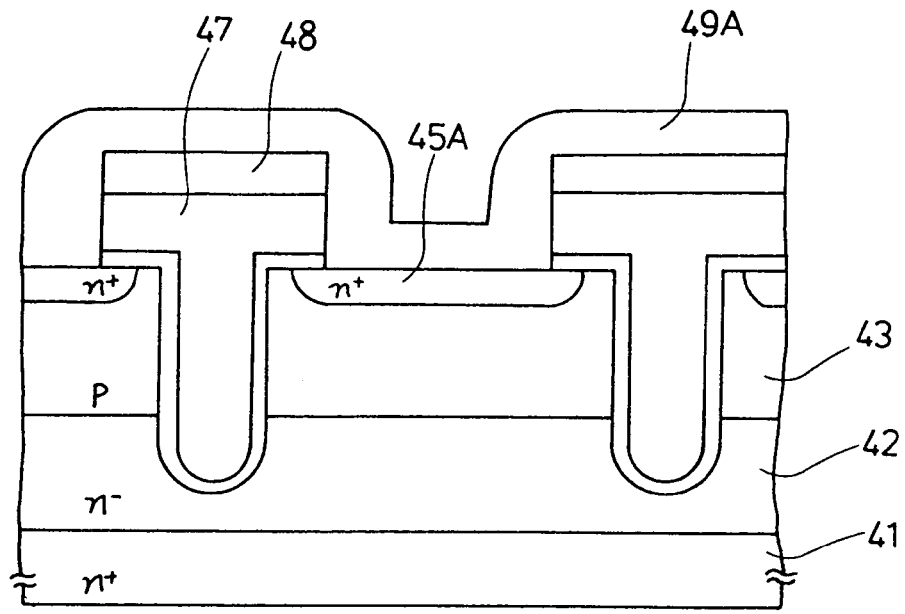
FIG. 15 is a section view illustrating the method of fabricating the power MOSFET according to the third embodiment of the invention.

As shown in FIG. 15, thereafter, an NSG film 49A having a thickness of 8,000 A is formed on the entire surface.

Figure 16:
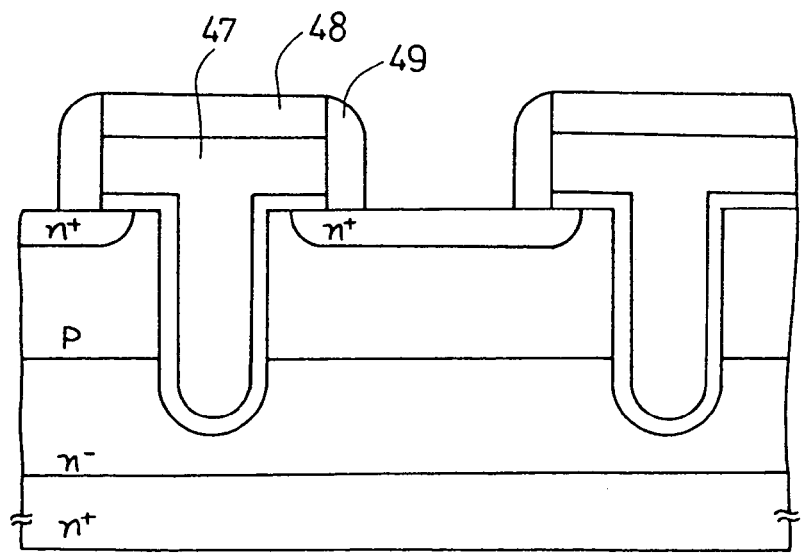
FIG. 16 is a section view illustrating the method of fabricating the power MOSFET according to the third embodiment of the invention.

As shown in FIG. 16, the entire surface is etched back to form the side wall insulator 49 on the side walls of the gate electrode 47 and the NSG film 48.

Figure 17:
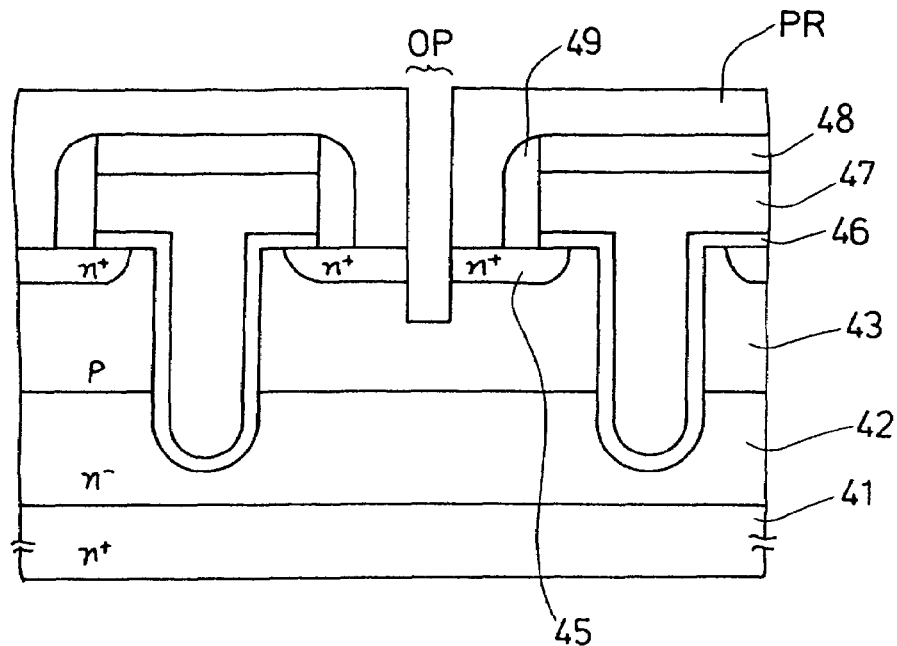
FIG. 17 is a section view illustrating the method of fabricating the power MOSFET according to the third embodiment of the invention.

A photoresist is applied to the entire surface and then patterned, thereby forming a resist mask PR in which an opening OP is formed at the center of the n+ impurity region layer 45A as shown in FIG. 17. The n+ impurity region layer 45A is etched with using the resist mask as a mask; to form a recess which passes through the layer.

Figure 18:
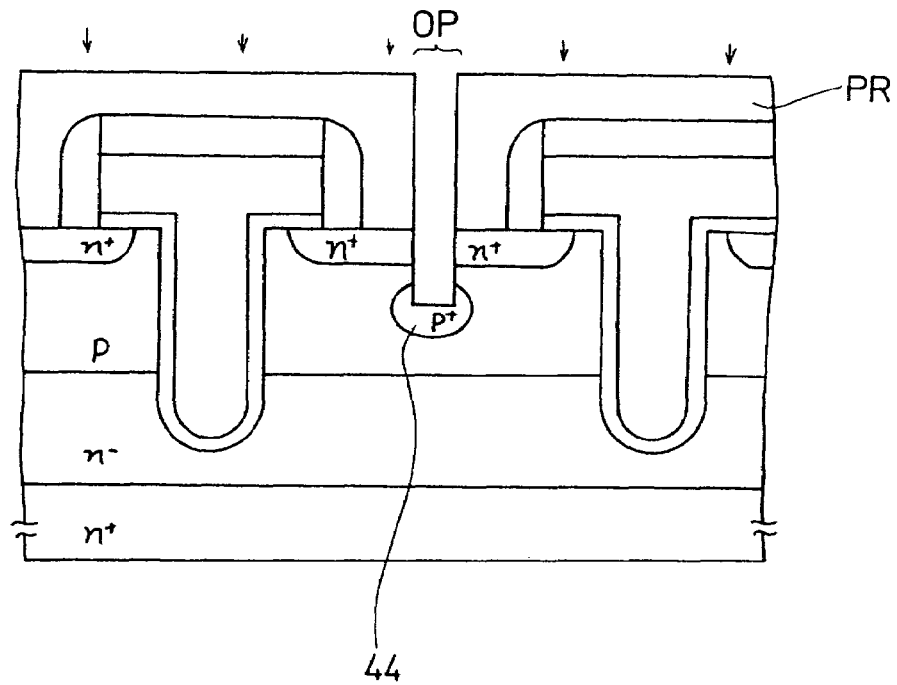
FIG. 18 is a section view illustrating the method of fabricating the power MOSFET according to the third embodiment of the invention.
Figure 19:
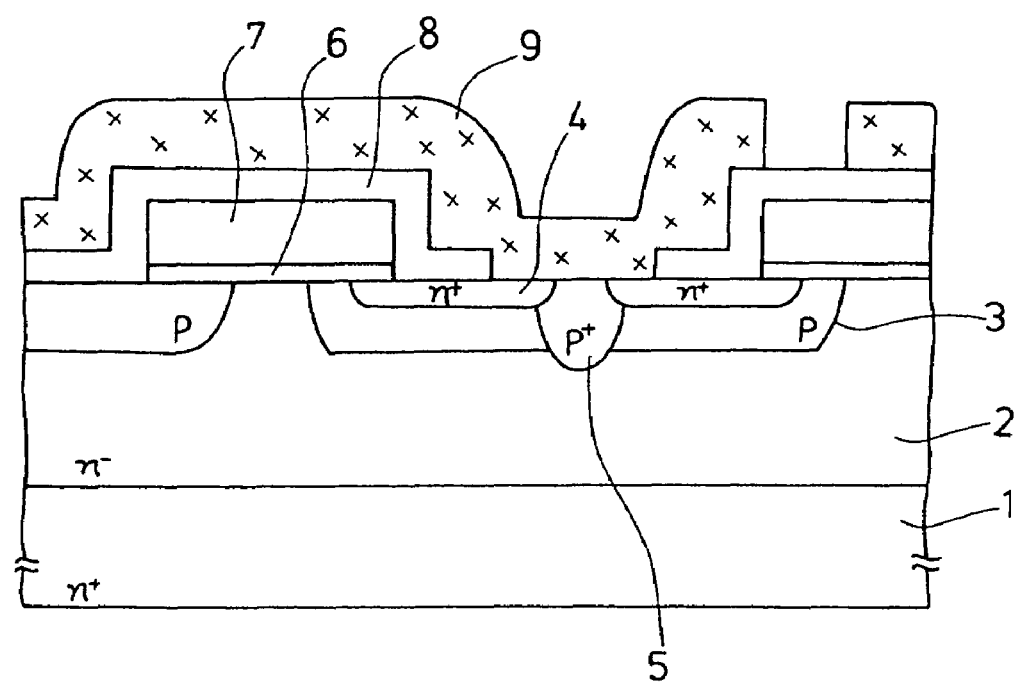
FIG. 19 is a section view illustrating the structure of a planar type power MOSFET of the prior art.
Figure 20:
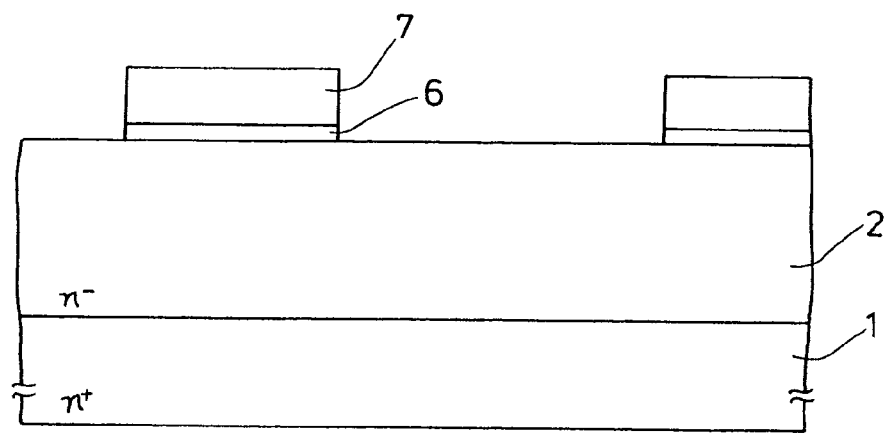
FIG. 20 is a section view illustrating a method of fabricating the power MOSFET of the prior art.
Figure 21:
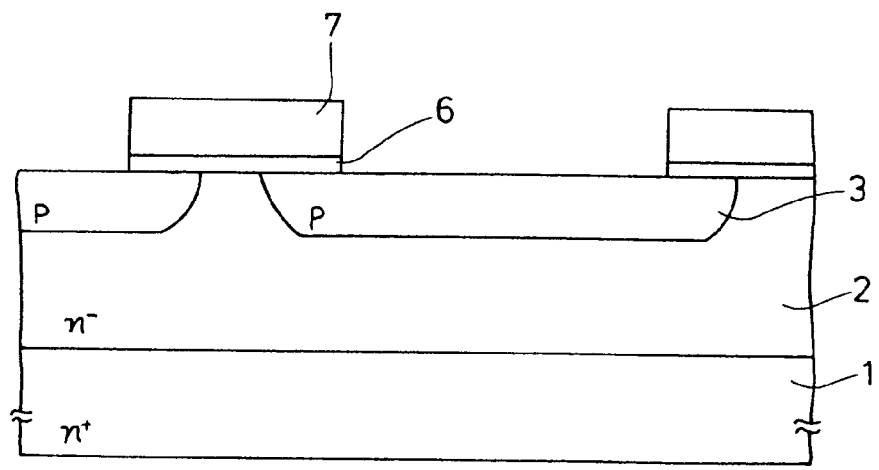
FIG. 21 is a section view illustrating the method of fabricating the power MOSFET of the prior art.
Figure 22:
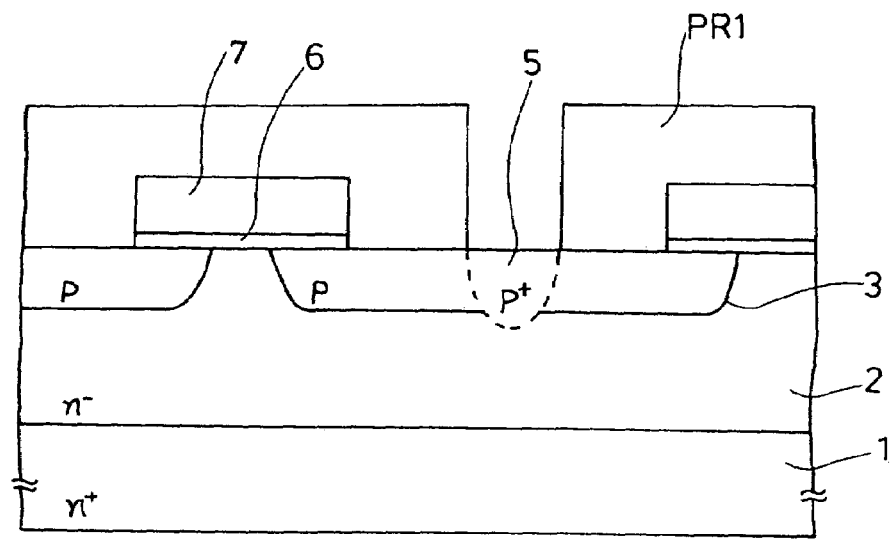
FIG. 22 is a section view illustrating the method of fabricating the power MOSFET of the prior art.
Figure 23:
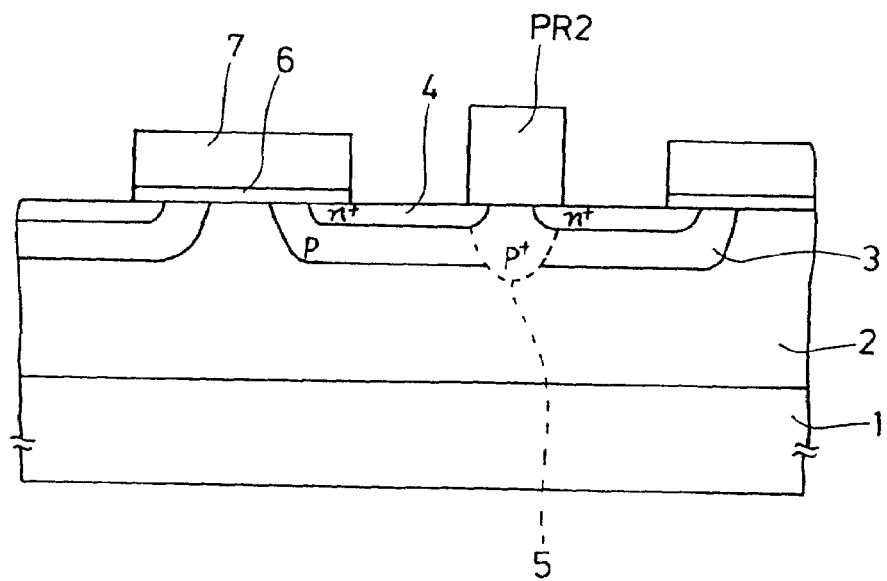
FIG. 23 is a section view illustrating the method of fabricating the power MOSFET of the prior art.
Figure 24:
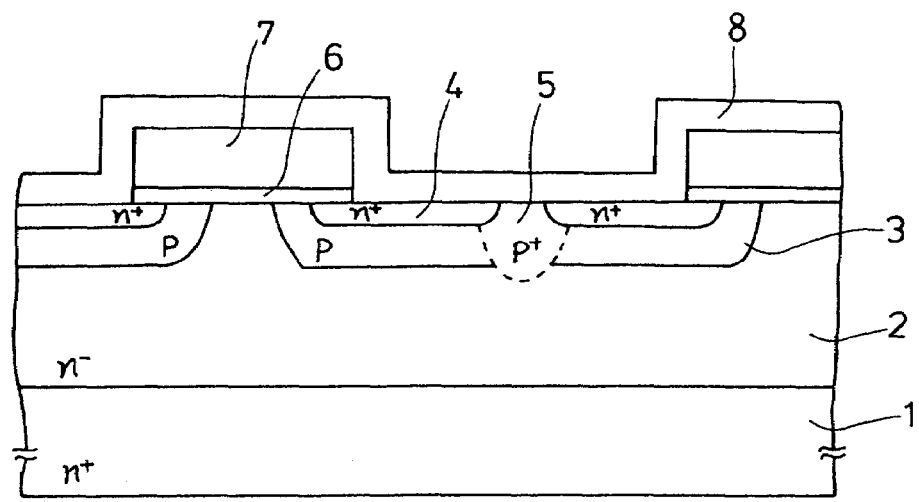
FIG. 24 is a section view illustrating the method of fabricating the power MOSFET of the prior art.
Figure 25:
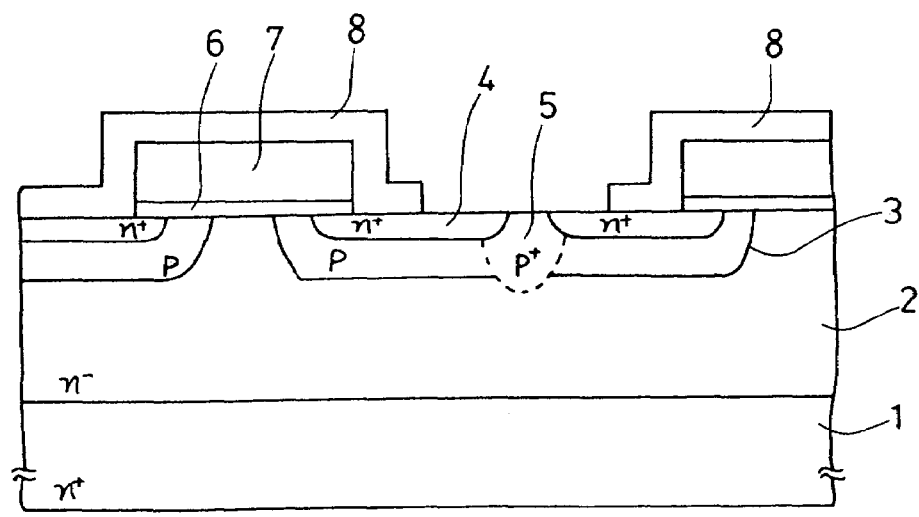
FIG. 25 is a section view illustrating the method of fabricating the power MOSFET of the prior art.
Figure 26:
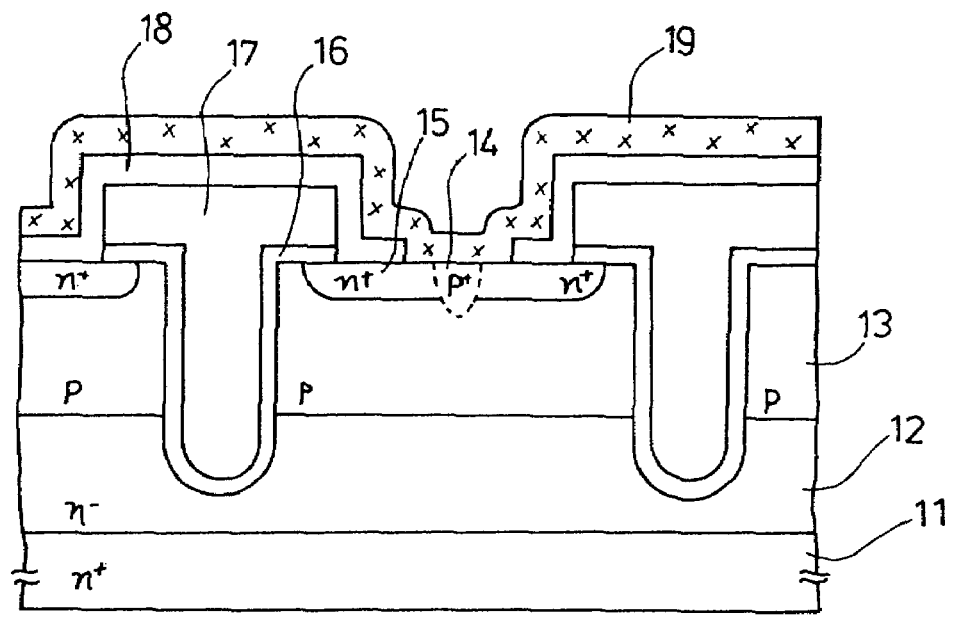
FIG. 26 is a section view illustrating the structure of a trench type power MOSFET of the prior art.

A p-type impurity is injected into the entire surface while the resist mask PR remains to exist, so that the body region layer 44 consisting of the p+ impurity diffusion region is formed below the recess as shown in FIG. 18.

The resist mask PR is then removed away, a film of a metal such as aluminum is formed on the entire surface, and the metal film is patterned, with the result that the trench type power MOSFET having the structure of FIG. 12 is formed.

According to the method of fabricating a trench type power MOSFET of the embodiment, unlike the prior art, none of resist masks are used when the source region and the body region are to be formed, and, the body region is formed by selectively etching the n+ impurity region layer to be source region 45, forming a trench which reaches to the channel region 43, and injecting a p+ impurity into the bottom of the trench.

Therefore, fine patterning can be performed. This produces an advantage that the cell density can be further increased.

In the entire process of the production method, a photomask is required only in the following four steps:

1) the step of forming the patterning mask for forming the trench, 2) the step of forming the patterning mask for forming the gate electrode (FIG. 14), 3) the step of forming the mask for forming the recess for forming the body region (FIG. 17), and 4) the step of forming the mask for forming the wiring layer.

Therefore, the problems in that the number of mask steps and accompanying steps is very large, that the production process is complicated, and that the production cost is high can be suppressed as much as possible.

In the first to third embodiments, the gate electrode is made of polysilicon. The invention is not restricted to polysilicon. Alternatively, for example, polycide or a metal may be used. Further plurality of the power MOSFETs can be integrated on a cell region of a substrate in a matrix structure. In the structure, one of gate electrode or source region is formed in a lattice structure, and the other is formed so as to be a plurality of independent regions.

Furthermore, it is a matter of course that the conditions such as the thickness of various films and the like are not limited to the above-mentioned values.

As described above, according to the method of fabricating a semiconductor device of the invention, an impurity of a second conduction type is implanted into a surface layer of the drain layer of the first conduction type with using a gate electrode as a mask, thereby forming a channel region layer, an impurity of a first conduction type is introduced (implanted) into the channel region layer with using the gate electrode as a mask, thereby forming a impurity region of the first conduction type, a third insulating film which covers the surface of the impurity region, side walls of the gate insulating film, the gate electrode, and the second insulating film, and the upper face of the second insulating film is formed, the third insulating film is etched back to form a side wall insulator consisting of the third insulating film, on side walls of the gate insulating film, the gate electrode, and the second insulating film, and impurity region is etched to form a recess, thereby forming a source region layer consisting of a part of the impurity region.

Therefore, in the photolithography process of forming a resist mask for patterning, only three photomasks are required for the following steps:

1) the step of forming the mask for forming the thick oxide film for the initial bonding pad formed on a peripheral portion of the substrate, 2) the step of forming the patterning mask for forming the gate electrode, and 3) the step of forming the mask for forming the wiring layer.

According to this configuration, as compared with the prior art production method in which six photomasks are used in the production of a planar type power MOSFET, the number of mask steps and accompanying steps can be largely reduced, the labor of the production process can be reduced, and the production cost can be largely lowered.

According to the other method of fabricating a semiconductor device of the invention, an impurity of a first conduction type is implanted into the channel region layer with using the gate electrode as a mask, thereby forming a impurity region of the first conduction type, a third insulating film is formed on the entire surface, the third insulating film is etched back to form a side wall insulator which covers side walls of the gate insulating film, the gate electrode, and a first insulating film, a photoresist is applied to the entire surface, exposure and developing processes are performed to form an opening at a center portion of the impurity region, an etching is performed with using the resist film as a mask to form a recess which passes through the center portion of the impurity region and reaches a channel layer, and a source region layer consisting of a part of the impurity region, an impurity of a second conduction type opposite to the first conduction type is implanted into a lower portion of the recess, with using the resist film as a mask, thereby forming a body region layer, and the resist film is removed away.

Therefore, in the photolithography process of forming a resist mask for patterning, only four photomasks are required for the following steps:

1) the step of forming the patterning mask for forming the trench, 2) the step of forming the patterning mask for forming the gate electrode, 3) the step of forming the mask for forming the recess for forming the body region, and 4) the step of forming the mask for forming the wiring layer.

According to this configuration, as compared with the prior art production method in which six photomasks are used, in a production of a trench type power MOSFET, a photomask step and accompanying steps can be omitted. Therefore, the problems of the prior art in that the production process is complicated, and that the production cost is high can be suppressed as much as possible.

What is claimed is:

1. A method of fabricating a semiconductor device, comprising the steps of:
    forming a drain layer of a first conduction type on a surface of a semiconductor substrate of the first conduction type;
    introducing an impurity of a second conduction type opposite to the first conduction type into an entire surface of said drain layer, thereby forming a channel layer;
    forming a trench so as to penetrate said channel layer and reach said drain layer using a first mask;
    forming a first insulating film on an inner wall of said trench and a surface of said channel layer;
    forming a conductive layer on said first insulating film;
    forming a second insulating film on said conductive layer;

patterning said second insulating film, said conductive layer, and said first insulating film with using a same second mask, to form a gate insulating film of said first insulating film, and a gate electrode of said conductive layer;

implanting an impurity of the first conduction type into a surface of said channel layer with using said gate electrode as a mask, thereby forming a impurity region of the first conduction type;

forming a third insulating film on an entire surface;

etching back said third insulating film to form a side wall insulator which covers side walls of said gate insulating film, said gate electrode, and said first insulating film;

forming a third mask having an opening located in a center of the impurity region and cover an entire surface except for the opening, before etching the impurity region;

etching the impurity region by using the third mask to form a recess to penetrate the impurity region and reach to the channel region, thereby forming a source region of the impurity region; and implanting an impurity of the second conduction type into a bottom of said recess, with remaining said third mask, thereby forming a body contact region; and removing said third mask; and forming a second conductive layer which covers said source region, said body contact region, said side wall insulator, and said second insulating film, and patterning said second conductive layer by using a fourth mask, thereby forming a wiring layer.

2. The method of fabricating a semiconductor device according to claim 1, wherein said step of forming a source region is formed before the step of forming a trench.

3. The method of fabricating a semiconductor device according to claim 1, wherein the gate electrode is formed on the first insulating film to fill the trench and to cover the periphery of the trench formed on the channel region.

4. The method of fabricating a semiconductor device according to claim 1, wherein the opening of the third mask is formed smaller than a region of the impurity region between the adjacent sidewall insulators.

5. The method of fabricating a semiconductor device according to claim 1, wherein the source is separated from the trench.

6. The method of fabricating a semiconductor device according to claim 1, wherein an upper surface and a side surface of the source region are directly contacted with the wiring layer.

* * * * *